(12) United States Patent
King et al.

(10) Patent No.: US 6,438,045 B1
(45) Date of Patent: *Aug. 20, 2002

(54) REDUNDANCY MAPPING IN A MULTICHIP SEMICONDUCTOR PACKAGE

(75) Inventors: Jerrold L. King, Morgan Hill, CA (US); Jerry M. Brooks, Caldwell, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/879,426

(22) Filed: Jun. 12, 2001

Related U.S. Application Data

(63) Continuation of application No. 09/219,808, filed on Dec. 23, 1998, now Pat. No. 6,246,615.

(51) Int. Cl.[7] ................................................. G11C 7/00
(52) U.S. Cl. ............................ 365/200; 365/52; 365/63
(58) Field of Search ............................ 365/200, 52, 63

(56) References Cited

U.S. PATENT DOCUMENTS

| | | | |
|---|---|---|---|
| 4,380,066 A | 4/1983 | Spencer et al. | 371/10 |
| 4,974,048 A | 11/1990 | Chakravorty et al. | 357/40 |
| 5,627,786 A | 5/1997 | Roohparvar | 365/200 |
| 5,706,292 A | 1/1998 | Merritt | 371/10.2 |
| 5,764,574 A | 6/1998 | Nevill et al. | 365/200 |
| 5,808,946 A | 9/1998 | Roohparvar | 365/200 |
| 5,812,468 A | 9/1998 | Shirley | 365/200 |
| 5,914,907 A | * 6/1999 | Kobayashi et al. | 365/200 X |
| 6,008,538 A | 12/1999 | Akram et al. | 257/723 |

* cited by examiner

*Primary Examiner*—Huan Hoang
(74) *Attorney, Agent, or Firm*—Schwegman, Lundberg, Woessner & Kluth, P.A.

(57) ABSTRACT

A multichip semiconductor package provides redundancy mapping from one semiconductor chip to another. The semiconductor device can be salvaged, where normally it normally would be considered scrap. This is particularly important where multiple semiconductor chips are physically connected as a common unit. One multichip integrated circuit package has semiconductor chips integrally formed on a unitary substrate, and each semiconductor chip includes redundant circuitry adapted to selectively replace primary circuitry. Electrical interconnects couple the redundant circuitry from a one semiconductor chip to a second semiconductor chip.

21 Claims, 7 Drawing Sheets

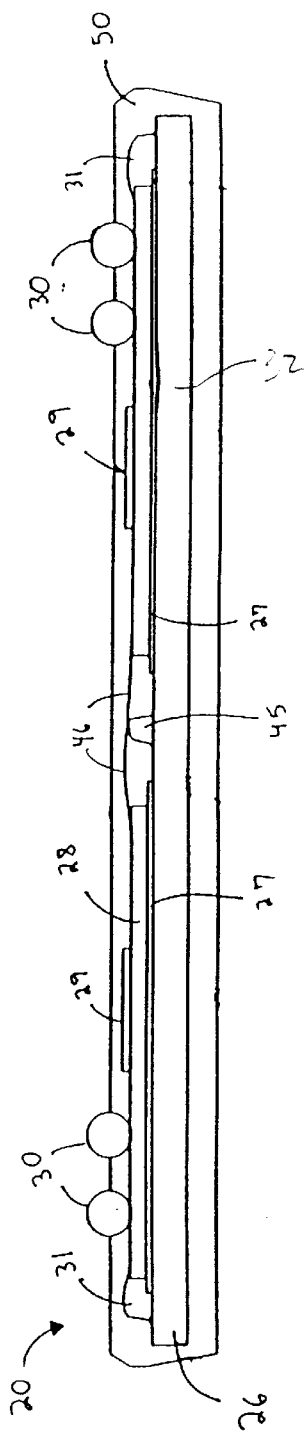

REDUNDANCY MAPPING IN A MULTICHIP SEMICONDUCTOR PACKAGE

This application is a Continuation of U.S. application Ser. No. 09/219,808, filed Dec. 23, 1998, now U.S. Pat. No. 6,246,615.

TECHNICAL FIELD OF THE INVENTION

The present invention relates generally to multichip semiconductor packages and in particular the present invention relates to redundancy mapping in multichip semiconductor packages.

BACKGROUND OF THE INVENTION

As the number of electronic elements contained on semiconductor integrated circuits continues to increase, the problems of reducing and eliminating defects in the elements becomes more difficult. To achieve higher population capacities, circuit designs strive to reduce the size of the individual elements to maximize available die real estate. The reduced size, however, makes these elements increasingly susceptible to defects caused by material impurities during fabrication. These defects can be identified upon completion of the integrated circuit fabrication by testing procedures, either at the semiconductor chip level or after complete packaging. Scrapping or discarding defective circuits is economically undesirable, particularly if only a small number of elements are actually defective.

Relying on zero defects in the fabrication of integrated circuits is an unrealistic option, however. To reduce the amount of semiconductor scrap, therefore, redundant elements are provided on the circuit. If a primary element is determined to be defective, a redundant element can be substituted for the defective element. Substantial reductions in scrap can be achieved by using redundant elements.

One way to reduce semiconductor scrap is to provide redundant elements on the integrated circuits. If a primary element is defective a redundant element can be substituted for that defective element. One example of an integrated circuit device which uses redundant elements is electronic memory. Typical memory circuits comprise millions of equivalent memory cells arranged in addressable rows and columns. By providing redundant elements, defective memory cells or columns can be replaced. Because the individual primary memory cells of a memory are separately addressable, replacing a defective cell typically comprises opening fuse-type circuits to 'program' a redundant cell to respond to the address of the defective primary cell. This process is very effective for permanently replacing defective primary memory cells. For example, FIG. 1 illustrates a typical memory circuit where primary memory columns ($PRIME_0$ to $PRIME_i$) are selectively connected to data communication lines ($DATA_0$ and $DATA_i$). When a primary column is addressed via external address lines, the appropriate select signal ($SEL_0$ to $SEL_i$) is activated. If a primary column is determined to be defective, its select signal is forced to a permanent inactive state, and a compare circuit is programmed to activate an appropriate redundant select signal ($RSEL_0$ to $RSEL_i$). This programming is typically performed using fusible circuits. When an address of the defective column is provided on the address lines, the compare circuit responds by activating the redundant select signal to couple the redundant column to the appropriate data communication line.

Because the individual primary elements of a memory are separately addressable, replacing a defective element typically comprises selecting a bank of switch circuits, each switch circuit typically being an antifuse or a fuse such that the bank is known as an antifuse bank or a fuse bank, respectively, to 'program' a redundant element to respond to the address of the defective element, and then enabling the redundant element by programming an enable antifuse. This process is very effective for permanently replacing defective primary elements. A problem can occur, however, when an integrated circuit is fabricated with more defects than available redundant circuits. As such, the circuit will become scrap.

For the reasons stated above, and for other reasons stated below which will become apparent to those skilled in the art upon reading and understanding the present specification, there is a need in the art for a semiconductor device which can be repaired to correct defects which out number available redundant circuitry on the same semiconductor die.

SUMMARY OF THE INVENTION

The above mentioned problems with semiconductor devices and other problems are addressed by the present invention and will be understood by reading and studying the following specification. A multichip integrated circuit package is described which provides internal redundancy between chips.

In particular, the present invention describes a multichip integrated circuit package is described which comprises a plurality of semiconductor chips integrally formed on a unitary substrate. Each of the plurality of semiconductor chips comprises redundant circuitry adapted to selectively replace primary circuitry. A plurality of electrical interconnects are provided to couple the redundant circuitry from a first one of the plurality of semiconductor chips to a second one of the plurality of semiconductor chips.

In another embodiment, a multichip integrated circuit package comprises a plurality of integrated circuit memory chips integrally formed on a unitary substrate. Each of the plurality of integrated circuit memory chips integrally comprises an array of primary memory cells and redundant memory cells. A plurality of electrical interconnects couple the redundant memory cells from a first one of the integrated circuit memory chips to a second one of the integrated circuit memory chips. Control circuitry is provided to select the redundant circuitry from the first one of the plurality of integrated circuit memory chips.

A method of making a multichip integrated circuit package is described. The method comprises integrally forming a plurality of isolated integrated circuit chips on a unitary substrate, and electrically connecting the plurality of isolated integrated circuit chips using interconnects to couple redundant circuitry from a first one of the plurality of integrated circuit chips to a second one of the plurality of integrated circuit chips.

BRIEF DESCRIPTION OF THE DRAWINGS

FIG. 5 is a cross section view of the multichip package of FIG. 4;

FIG. 6 is a top view of a multichip package having conductive leads extending beyond encapsulating material;

FIG. 7 is a top view of a multichip package having conductive leads sheared flush with encapsulating material;

DETAILED DESCRIPTION OF THE INVENTION

Figure 1:
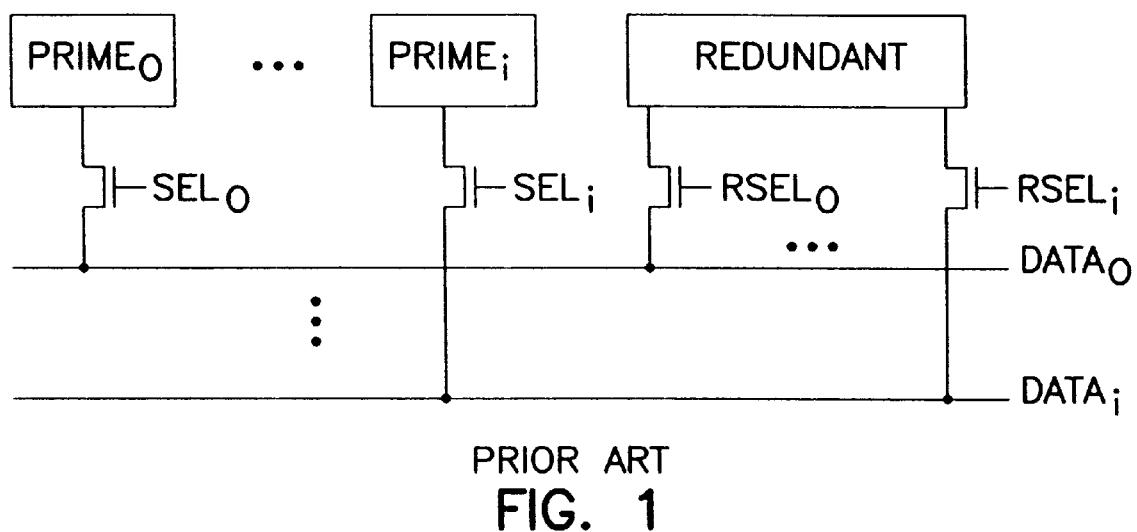
FIG. 1 is a block diagram of a portion of a prior art memory device.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The present invention relates to a multichip semiconductor package having a plurality of semiconductor chips fabricated as a singular coextensive substrate which utilizes a novel redundancy scheme. The semiconductor chips can be integrated memory circuits.

In the most general sense, a memory circuit comprises memory cells which store data. Depending upon the type of memory, this data can be read, or read and written. That is, some memories are read-only while others allow data to be read, manipulated, and re-written. Because many types of dynamic memories store data as a charge on a capacitor, sense amplifiers are implemented to detect small charges and amplify the charge for further processing. Static memories utilize sense amplifier circuits to detect data stored in memory cells.

Dynamic Random Access Memories

Figure 2:
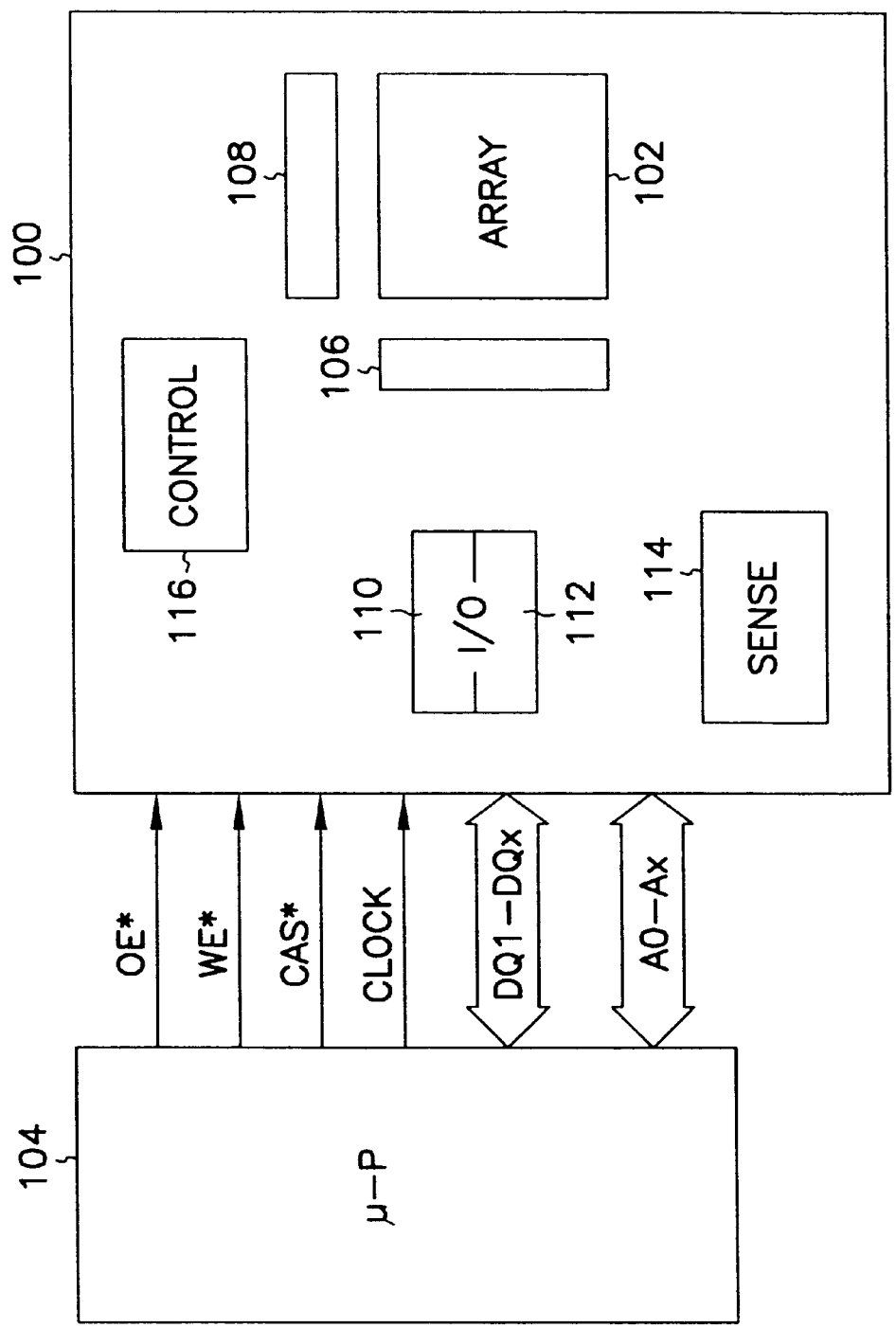
FIG. 2 is a block diagram of a DRAM memory device of the present invention.

A DRAM 100 is described in reference to FIG. 2 as having a memory array 102 and associated circuitry for reading from and writing to the memory array. The memory array is arranged in an x-y grid, or rows and columns of memory cells. The DRAM array can be accessed by a microprocessor 104, memory controller, a chip set, or other external system through input/output connections including address lines A0–Ax. Row decoder 106 decodes a row address from an address signal provided on A0–Ax, and addresses the corresponding row of the DRAM array. Likewise, column decoder 108 decodes a column address from an address signal provided on A0–Ax, and addresses the corresponding column of the DRAM array. Data stored in the DRAM array can be transferred to outputs DQ1–DQx through the data output buffer 110. Likewise, data input buffer 112 is used to receive data from DQ1–DQx and transfer the data to the DRAM array. Sense amplifier circuitry 114 is provided to sense and amplify data stored on the individual memory cells of the DRAM array. Control circuitry 116 is provided to monitor the memory circuit inputs and control reading and writing operations.

The input and output connections of the DRAM 100 used to communicate with the microprocessor 104 are described as follows. Output enable (OE*) enables the output buffer 110 of the DRAM. Write enable (WE*) is used to select either a read or write operation when accessing the DRAM. Row address strobe (RAS*) input is used to clock in the eleven row address bits. Column address strobe (CAS*) input is used to clock in the ten column address bits. Address input lines A0–Ax are used to identify a row and column address. DRAM data input/output lines DQ1–DQx provide data input and output for the DRAM. An optional clock signal can be provided by the microprocessor as described below for operating the memory circuit in a synchronous mode.

It will be understood that the above description of a DRAM is intended to provide a general understanding of the memory and is not a complete description of all the elements and features of a DRAM. Further, the present invention is equally applicable to any size and type of memory circuit and is not intended to be limited to the DRAM described above.

Static Random Access Memories

Static random access memories (SRAM) are similar to the above described RAMs. Data is stored in memory cells which are selectively accessed through externally provided addresses. The typical static memory cell is a latch circuit which is more complicated than the typical dynamic memory cell, thereby reducing the available memory density of SRAMs. SRAMs, however, can be operated at faster data rates and are ideal for applications such as cache memories.

Figure 3:
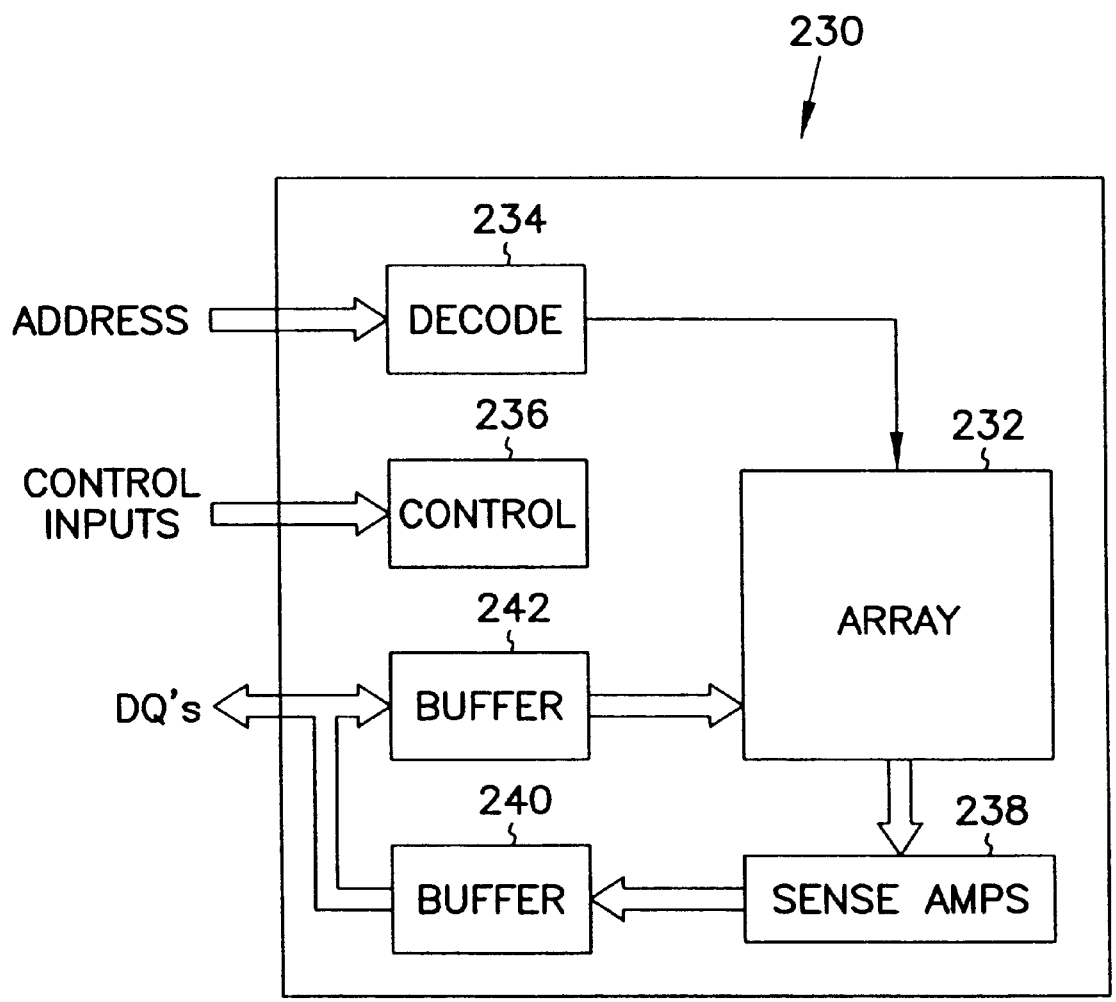
FIG. 3 is a block diagram of a static random access memory (SRAM)

Referring to FIG. 3, a block diagram of the a typical SRAM 230 is described. The SRAM includes a memory array 232 of static memory cells. Address decode circuitry 234 is provided to decode an address provided on the address inputs and access the memory array. Control circuitry 236 controls the read and write operations performed by the memory in response to external control inputs. Data read from the memory array is sensed and amplified by sense amplifier circuit 238 and output on data communication lines (DQ) via output buffer 240. Data provided on the DQ lines is written to the memory array through input buffer/driver circuit 242.

Memory array 232 is arranged in rows and columns of memory cells. The columns are defined by a pair of bit lines which communicate data stored in the memory cells to the sense amplifier circuits. The bit lines are complements of each other such that in an active state one bit line will be at a low signal level and the other bit line will be at a high signal level.

Multichip Packaging

Figure 4:
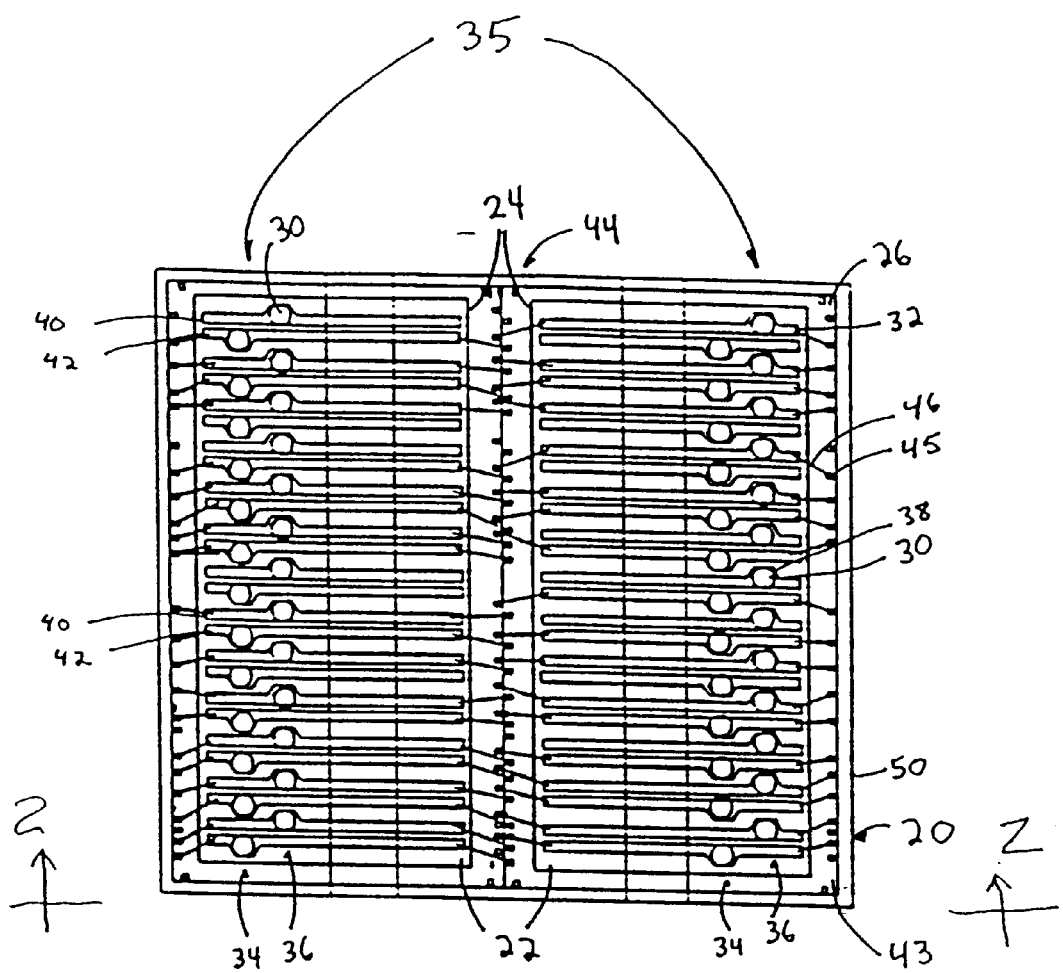
FIG. 4 is a top view of a multichip package taken beneath a top layer of encapsulating material.

With references to FIGS. 4 and 5, a multichip semiconductor package, depicted generally as package 20, has a plurality of semiconductor chips 22 each arranged in electrical isolation, one from another, adjacently along a terminal boundary 24 thereof as a singular coextensive substrate 26. Chips 22 are integrally formed on substrate 26 which may be a semiconductor material such as gallium arsenide, silicon, or can be silicon on sapphire, silicon on insulator. Substrate 26, preferably a monocrystalline silicon wafer, has the individual semiconductor chips 22 fabricated thereon by conventional techniques currently employed in the manufacture of single-chip packages. Instead of dividing individual chips 22 into discreet single chip packages by a singulation process performed upon the wafer, the individual chips, though electrically isolated, form another device. The device is electrically connected and encapsulated into a singular multichip package 20 as described hereinafter.

Attached to semiconductor chip 22, preferably by lamination techniques using a lead-over-chip (LOC) adhesive 27, a lead locking tape 29, and a wire bonding segment 31, is a lead frame 28 to which electrodes 30 are electrically contacted. Lead frame 28 is provided, one per package 20, to yield electrical continuity between electrodes 30 and the devices of semiconductor chip 22 by way of a singular conductive lead 32, one per each electrode 30. Electrode 30 is connected to conductive lead 32 at a selected position along a length thereof. It should be appreciated that each selected position of connection between each electrode 30 and each respective conductive lead 32 yields an arrangement of electrodes 30 about package 20, known commonly as a package footprint. The package footprint has a corresponding footprint on a PWB (not shown), for example, that allows for completion of an electrical circuit between the internal devices of package 20 and the circuit fabricated on the PWB when the two footprints are electrically connected. Since each electrode 30 is not directly connected to semiconductor chip 22 by way of bond pads or wiring traces, as are conventional BGA'S, flip-chips, and chip-scale packages, the package footprint can remain consistent in size and shape despite continual size reductions in individual semiconductor chips. This is possible because the length of conductive lead 32 acts as an electrical bus from the internal devices in semiconductor chips 22 to the position or electrode 30. As semiconductor chip 22 is reduced in size, the dimensions of conductive lead 32 are adjusted and electrical continuity remains bussed out to electrode 30. Typically, as in FIGS. 6 and 7, conductive leads 32 are plated at an electrode bond area 58 with a thin layer of metal to improve the strength and conductivity between electrode 30 and conductive lead 32. Since electrodes 30 can be solder balls, the metal composition thereof is preferably gold, palladium/nickel, or tin.

The package footprint has rows 35 of electrodes 30 disposed across semiconductor chips 22 in two substantially parallel lines 34, 36 with each individual electrode 30 being contacted, one per each conductive lead 32, along an extended portion 38 of the substantially rectangular conductive lead. The extended portion is present on conductive lead 32 because the width of the remainder of conductive lead 32, while a cost effective use of materials, is too thin to fully accommodate electrode 30. It should be appreciated that electrode 30 only exceeds the width of conductive leads 32 to the extent necessary to prevent mechanical bonding failures, such as solder joint failures.

Since conductive leads 32 are preferably arranged in sets of pairs 40, 42 across semiconductor chips 22. Each pair set 40, 42 is arranged in relatively close proximity. Each extended portion 38 of conductive lead 32 in the same or juxtaposed to pair set 40, 42. In this manner, multiple electrodes 30 are available for close proximity positioning while, simultaneously, avoiding electrical shorts in and amongst pair sets 40, 42 which would otherwise occur with electrodes of the size and shape depicted if electrodes 30 were all placed side-by-side in a linear fashion. It should be appreciated that changes in the size and shape of electrode 30 are contemplated that would yield other distinct package footprints without altering the fabrication or effectiveness of singular coextensive substrate 26 having a plurality of semiconductor chips 22 integrally formed thereon. For example, it is contemplated that the portion of electrode 30 contacting conductive lead 32, thereby making extended portions 38 superfluous. It is also contemplated that extended portions 38 could be alternated at opposite ends of their respective pair sets 40, 42 or arranged in other ways that maintain a cost effective conductive lead 32 while preventing electrical shorts.

The plurality of semiconductor chips 22 are electrically bonded together, along a periphery 43 and a central portion 44 of package 20, by way of bond pads 45 and bond wires 46 to form, for example, a larger package circuit, or as in a preferred embodiment, to expand the overall memory of semiconductor chip 22 through which electrical connections can be made between the active devices in chip 22 and external circuits. Bond wires 46 are preferably connected along a terminal end 48 of conductive leads 32 at a wire bond area 56, as depicted in FIGS. 3 and 4. Typically, conductive leads 32 are plated at wire bond area 56 with a thin layer of metal suitable for wire bonding, such as gold, silver or palladium/nickel to improve the strength and conductivity of the bond between conductive leads 32 and bond wires to:

Package 20 is encapsulated in a compound 50 which has openings 52 formed therein that partially expose conductive leads 32 at the selected connection positions, which is preferably electrode bond area 58. Openings 52 are sized and shaped according to the selected size and shape of electrodes 30 and are adjustable to correspond with changes in the selected size and shape. Compound 50, often a molding compound, is generally an electrically insulating formulation used to distribute power, dissipate heat and protect the active devices therein from thermo-mechanical stresses and pollutants found in the operating environment. Compound 50 can be a thermosetting epoxy resin, but may also be silicon, phenolic, or polyeurethane. The composition of compound 50 is generally derived from a balance of numerous engineering factors including the cost of manufacturing, production volume, expected use environment, expected use market and other related considerations. It is also contemplated that compound 50 may be polyimide compound useful as an alpha barrier.

In the embodiment depicted in FIG. 5, conductive leads 32 have been fully encapsulated within compound 50. There are other useful embodiments for conductive leads 32. For example, in FIG. 6, conductive leads 32 are extended out from compound 50 to facilitate chip testing and also to enable package 20 to be easily maneuvered during the manufacturing process. It is also contemplated that conductive leads 32 could remain attached to semiconductor chips 22 without any of, or as a compliment to, electrodes 30 so that a signal could be taken directly therefrom as package 20 is used in either a surface mount, or through-hole capacity. In FIG. 7, conductive leads 32 have been sheared flush with compound 50 after either testing or manufacturing in order to create a thicker and stronger terminal portion of package 20, or to remove any potential mechanical interferences from conductive leads 32.

Figure 8:
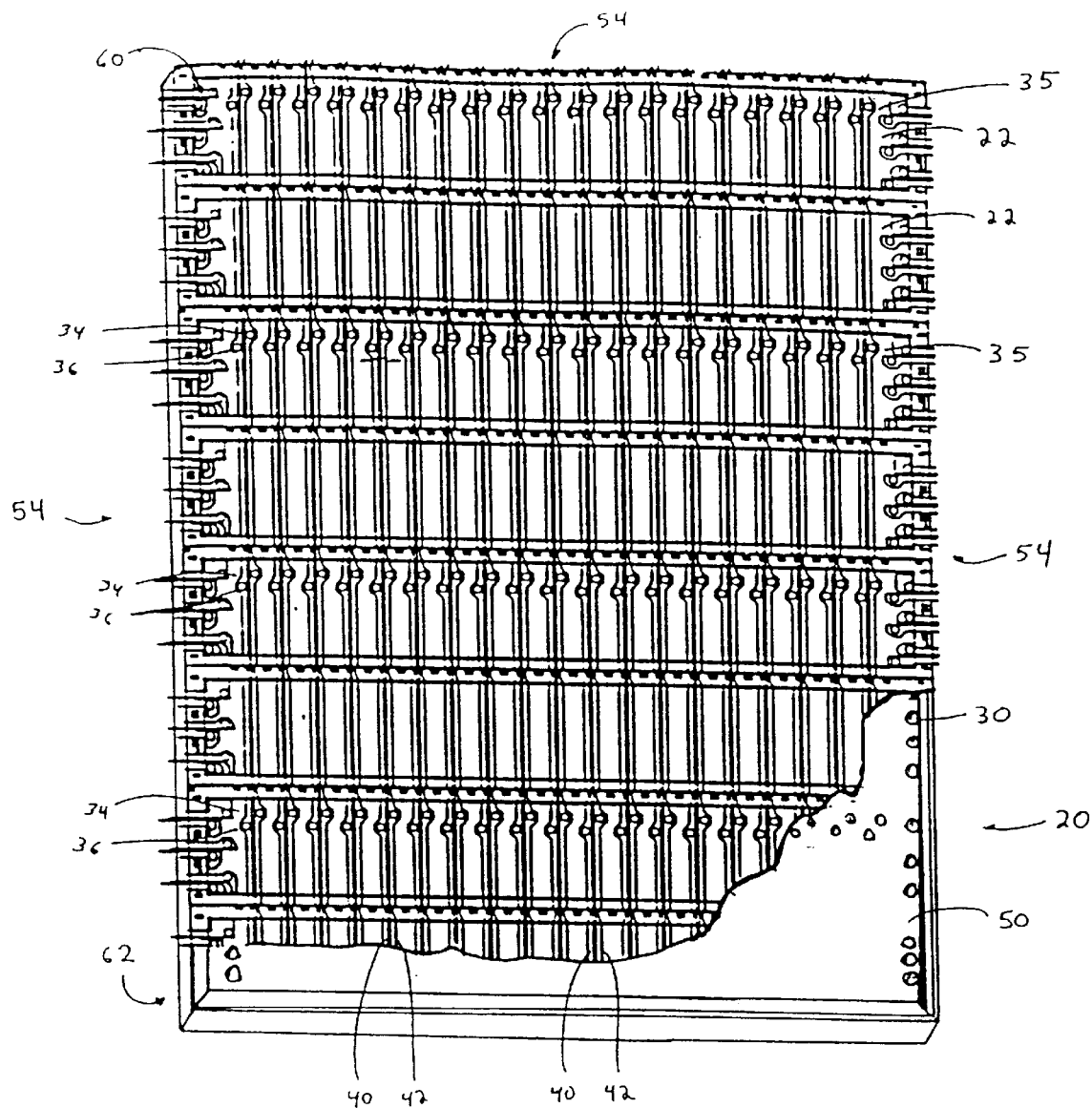
FIG. 8 is a top perspective view of a multichip package with a cut-away view through encapsulating material.

With reference to FIG. 8, package 20 has eight semiconductor chips 22 adjacently arranged in electrical isolation, in the manner previously described, with conductive leads 32 again disposed in pairs 40, 42 across substrate 26. Instead of the semiconductor chips 22 being interconnected by discretely wiring conductive leads 32 thereof, conductive leads 32 in this embodiment are bussed common to eliminate high wiring density within package 20 and to provide for redundant back-up in the event a semiconductor chip 22 has a bad, or deteriorated, signal line. The common bussing also allows for common addresses (A0, A1 . . . An), common data out (DO), common data queries (DQ) or voltage steady state (Vss) electrodes, for example, to be fabricated together electrically, thereby eliminating electrode repetition and reducing material costs. Although some signal lines are independent and cannot, for various reasons, be bussed common, such as individual chip enables (CE) and row address strobes (RAS), those signal lines can be grouped together into common areas for efficaciously facilitating interconnection with an external circuit, such as a PWB. For example, a plurality of wiring banks 54 are configured about the periphery of package 20 along three sides and about the interior of package 20 in rows 35 having two substantially parallel lines 34, 36 of electrodes 30. It should be understood that wiring banks 54 could all be grouped together, but to do so would be at the expense of increasing wiring densities and creating manufacturing difficulties such as having inadequate wiring angles for attaching bond pads 4 to conductive leads 32. Alternatives exist that will effectively accommodate the grouping of wiring banks 54 about package 20 that provide ease of electrical connection with other external circuits and are within the spirit of the present invention.

In response to industry demands for thin packages, this embodiment depicts compound 50 as being disposed upon top side 60 of substrate 26 while bottom side 62 remains uncovered. It is possible, however, that at least a partial encapsulation of compound 50 is applied about substrate 26 to prevent undesirable conditions, such as electrical shorting.

Although the arrangement of the discrete electrically isolated semiconductor chips 22 has heretofore been described as either being two or eight in number and fabricated in adjacent arrangement with one another within substantially rectangular packages, one skilled in the art should appreciate that still other embodiments exist that are within the express teachings of the present invention. For example, it is contemplated that semiconductor chips 22 range in preferred quantities from 2 to 8 but may also be as large as 64 or more. The arrangement of semiconductor chips 22 may also be fabricated into various other patterns so long as chips 22 remain as discrete, electrically isolated units integrally formed on singular coextensive substrate 26.

The steps of fabrication of multichip package 20 include a singular substrate 26 being fabricated with a plurality of electrically isolated semiconductor chips 22 thereon. Instead of a singulation process of sawing the individual chips into discrete single-chips for packaging, chips 22 are kept as integrally form electrically isolated elements that are there after electrically connected together. Next, bond pads 45 are provided to connect to the active devices (not shown) by exposing bond pads 45 through apertures in an insulating or passivation layer which forms the upper surface of chip 22.

Conductive leads 32, which form the inner portion of the singular lead frame 28, are then positioned over chips 22 and extended in length to an area near bond pads 45 for wire bonding connections thereto. Conductive leads 32 are usually prefabricated with a plating of a thin layer of suitable metal at wire bond area 56 but we can also be plated after encapsulation. In sequence, conductive leads 32 are connected to an upper surface of chips 22 with LOC adhesive 27. For a detailed description thereof, refer to U.S. Pat. No. 5,286,679, issued to Farnsworth et al., which is incorporated herein by reference.

Once connected, package 20 is at least partially encapsulated with compound 50 and openings 52 are formed therein to at least partially expose conductive leads 32. where exposure preferably is at electrode bond area 58. Also, conductive leads 32 are usually prefabricated with a plating of a thin layer of suitable metal at electrode bond area 38. After encapsulation, any remaining resin residue that is present on the wire or electrode bond area 56, 58 is removed by electrolytic or mechanical deflash processes known in the art.

Electrodes 30, preferably solder balls, are bonded to electrode bond areas 58 through openings 52 in compound 50. The solder balls may be attached, as is known in the art, by coating the solder balls or bond areas 58 with flux, placing the solder balls on electrode bond area 58 through openings 52 with conventional pick and place or shaker/hopper equipment, and reflowing the balls in place using an infrared or hot air reflow process. The excess flux is then removed with an appropriate cleaning agent. In this manner, the solder balls are electrically and mechanically connected to conductive leads 32 to form electrodes 30 external to compound 50. Other processes may also be used to form electrodes 30. For example, electrodes 30 may be "plated up" using conventional plating techniques rather than using the solder ball techniques as described above. The completed multichip semiconductor package 20 can then be assembled to a printed circuit board or the like using conventional surface mount or through hole processes and equipment.

Redundancy Mapping

As stated above, memory devices are typically fabricated with redundant elements. These elements can be individual memory cells, a row or column of cells, or an addressable block of cells. The redundant memory elements are used to replace defective memory elements. Address signals are typically re-routed, or mapped, from the defective memory element to the redundant memory element using fuse-type circuits. It will be appreciated by those skilled in the art that the ability to repair an integrated circuit, such as a memory device, is limited by the number of redundant elements provided on the integrated circuit. This limitation creates a problem when multiple integrated circuit chips are packaged in a common device, as described above.

Figure 9:
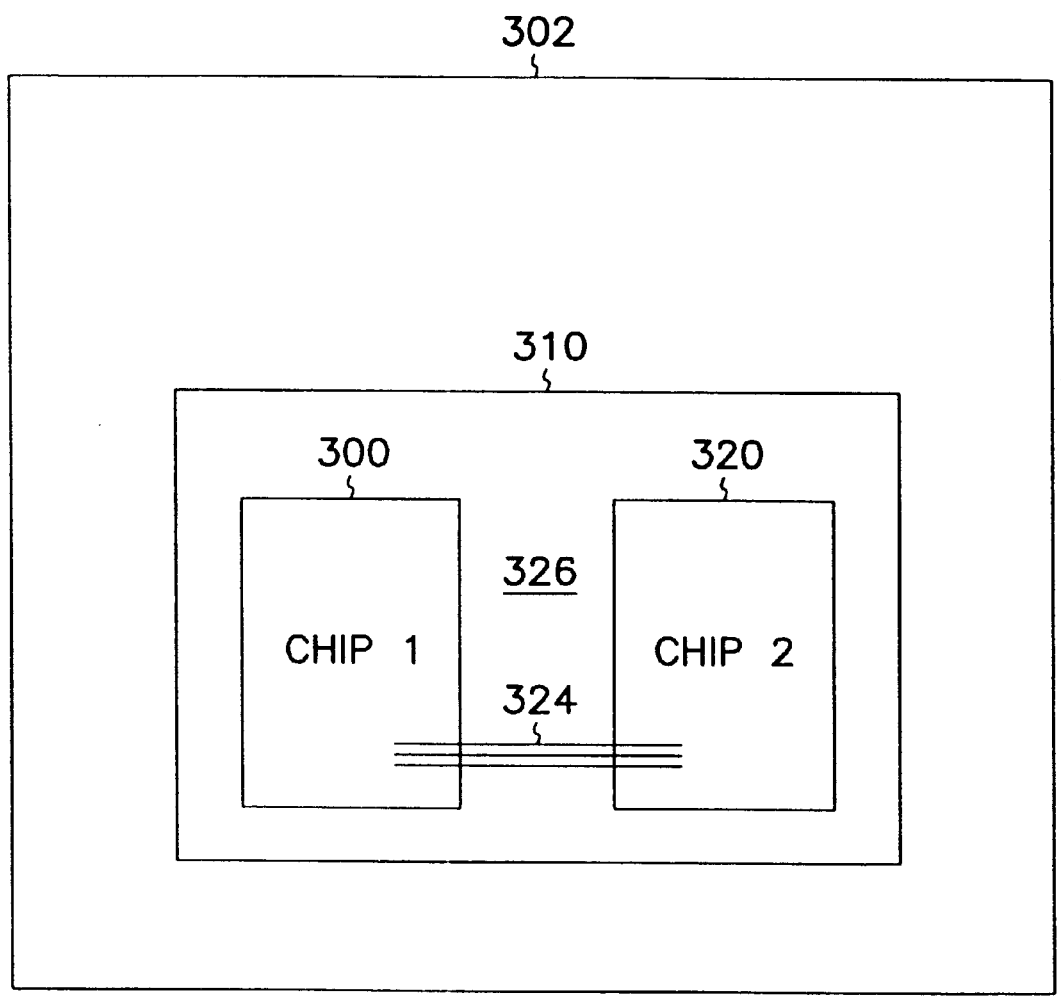
FIG. 9 is a block diagram of a multichip package using redundancy remapping between multiple chips.

The present invention provides for redundant elements from one of the semiconductor chips to be used by another of the semiconductor chips, as illustrated generally in FIG. 9. The package 302 includes multiple chips 300 and 320 formed on a unitary substrate 302. The two, or more, semiconductor chips are electrically connected such that an address of a memory element on chip 300 is re-routed to a memory element on chip 320 using electrical interconnects 324. This is accomplished through the use of known interconnect technology (lead frame, wire bonding etc.) to cross streets 326 between the chips in combination with fuse-type circuits (fuses, anti-fuses, non-volatile latches or memory) operating as a control circuit redundancy. For example, the redundant circuitry from 320 can be coupled to chip 300 using wire bonds and anti-fuse circuitry. Lead frames can be used to couple the multiple chip redundant circuits. In another embodiment, the integrated circuits are memory devices and can be soft coupled using available communication or control signal lines. This embodiment, reduces or eliminates the need for extra electrical interconnects between the multiple chips.

The present invention allows a semiconductor chip which contains more defective elements than redundant elements to be salvaged. For example, a memory chip with nine defective elements, but only eight redundant elements, can use one redundant element from another semiconductor memory chip provided in the same multichip 302 package.

CONCLUSION

A multichip semiconductor package has been described which provides redundancy mapping from one semiconductor chip to another. This allows for a semiconductor device to be salvaged, where normally it normally would be considered scrap. This is particularly important where multiple semiconductor chips are physically connected as a common unit.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A multichip integrated circuit memory device, comprising:
    a plurality of semiconductor memory chips integrally formed on a unitary substrate, each of the plurality of semiconductor memory chips being fabricated to be electrically-isolated, and each of the plurality of semiconductor memory chips including redundant memory circuits adapted to selectively replace primary memory circuits;
    control circuitry electrically connected to the plurality of semiconductor memory chips to couple the redundant memory circuits from a first one of the plurality of semiconductor memory chips to a second one of the plurality of semiconductor memory chips when there are more defective circuits on the second one of the plurality of semiconductor memory chips than there are redundant memory cells on the second one of the plurality of semiconductor memory chips.

2. The multichip integrated circuit memory device of claim 1 further including a lead frame attached to the unitary substrate and having a plurality of conductive leads each having an electrode protruding therefrom and each being connected to a unique bonding pad on one of the plurality of semiconductor memory chips.

3. The multichip integrated circuit memory device of claim 2 wherein the lead frame is laminated to the unitary substrate using lead-over-chip (LOC) adhesive.

4. The multichip integrated circuit memory device of claim 3 wherein a plurality of electrodes on the lead frame form an arrangement of electrodes to form a package footprint.

5. A multichip memory package, comprising:
    a first integrated memory circuit integrally formed in a unitary substrate and having a plurality of bonding pads, an array of primary memory cells, and a plurality of redundant memory cells;
    a second integrated memory circuit integrally formed in the unitary substrate and having a plurality of bonding pads, an array of primary memory cells, and a plurality of redundant memory cells, the second integrated memory circuit being fabricated to be electrically isolated from the first integrated memory circuit; and
    a lead frame electrically coupled to the bonding pads of the first integrated memory circuit and to the bonding pads of the second integrated memory circuit to provide electrodes for external connection, and to couple at least one of the plurality of redundant memory cells from the first integrated memory circuit to the second integrated memory circuit when there are more defective primary memory cells on the second integrated memory circuit than there are redundant memory cells on the second integrated memory circuit.

6. The multichip memory package of claim 5 wherein the lead frame is laminated to the unitary substrate using an adhesive and wherein the electrodes form an arrangement of electrodes to form a package footprint.

7. The multichip memory package of claim wherein the lead frame is partially encapsulated with a compound which has openings formed therein that partially expose the electrodes at selected connection positions corresponding to the package footprint.

8. The multichip memory package of claim 5 wherein the lead frame contains common bussing electrodes which allow for common addresses, common data out and common voltage electrodes which are electrically shared between the first integrated memory circuit and the second integrated memory circuit thereby eliminating electrode repetition and reducing material costs.

9. A memory device having a plurality of unsingulated integrated circuit memory chips, comprising:
    a substrate having a plurality of integrated circuit memory chips fabricated therein, each of the plurality of integrated circuit memory chips being fabricated as electrically isolated, and each further comprising:
        a plurality of bonding pads;
        a plurality of primary memory cells;
        a plurality of redundant memory cells; and
    a lead frame, comprising:
        a plurality of conductors, each conductor attached to at least one bonding pad of at least one of the plurality of integrated circuit memory chips, the lead frame operable for connecting the bonding pads and to replace a primary memory cell of a first one of the plurality of integrated circuit memory chips with a redundant memory cell of a second one of the plurality of integrated circuit memory chips.

10. The memory device of claim 9, wherein the primary mercury cell of the first one of the plurality of integrated circuit memory chips is defective.

11. The memory device of claim 10, wherein the plurality of the primary memory cells of the first one of the plurality of integrated circuit memory chips are defective and wherein there are more defective primary memory cells on the first one of the plurality of integrated circuit memory chips than there are redundant memory cells on the first one of the plurality of integrated circuit memory chips.

12. A multichip memory package, comprising:
    a plurality of memory chips integrally formed on a unitary substrate, each of the plurality of memory chips being simultaneously fabricated to be electrically-isolated from one another, and each of the plurality of memory chips including redundant memory circuits adapted to selectively replace primary memory circuits;
    control circuitry electrically connected to the plurality of memory chips to replace selected ones of the primary memory circuits of a first one of the plurality of mercury chips with selected ones of the redundant memory circuits of a second one of the plurality of memory chips; and a plurality of conductors attached to the unitary substrate and each being connected to bonding pads on the plurality of memory chips.

13. The multichip memory package of claim 12 whereby memory address signals are remapped from defective ones of the primary memory circuits to the selected ones of the redundant memory circuits.

14. The multichip memory package of claim 13 wherein the plurality of conductors include common bussing electrodes which allow for common address signals to be electrically shared between the plurality of memory chips.

15. The multichip memory package of claim 14 wherein the control circuitry is adapted to select the redundant memory circuits in response to an address signal of the defective ones of the primary memory circuits.

16. A multichip integrated circuit memory package, comprising:

a plurality of semiconductor memory chips integrally formed on a unitary substrate, each of the plurality of semiconductor memory chips includes redundant memory circuitry adapted to selectively replace primary memory circuitry; and a lead frame coupling the redundant memory circuitry from a first one of the plurality of semiconductor memory chips to replace defective ones of the primary memory circuitry of a second one of the plurality of semiconductor memory chips.

17. A multichip integrated circuit package, comprising:

a plurality of semiconductor chips integrally formed on the same, unitary substrate and being commonly, non-individually packaged thereon, each of the semiconductor chips comprising redundant circuitry capable of selectively replacing primary circuitry;

a plurality of electrical interconnects coupled to the semiconductor chips to couple the redundant circuitry from a first chip to a second chip, wherein the integrated circuit package is partially encapsulated with a compound which has openings formed therein that partially expose the plurality of electrical interconnects at selected connection positions to form external connections; and wherein the plurality of electrical interconnects contain common bussing electrodes which allow for common signal electrodes which are electrically shared between the plurality of semiconductor chips.

18. The multichip integrated circuit package of claim 17, wherein a plurality of the primary circuitry of the second chip are defective and wherein there are more defective primary circuitry on the second chip than there are redundant circuitry on the second chip.

19. A multichip integrated circuit package, comprising:

plural semiconductor chips fabricated on and in a singular co-extensive substrate, each of the semiconductor chips comprising redundant circuitry capable of selectively replacing defective primary circuitry;

a plurality of electrical interconnects coupled to the chips to couple the redundant circuitry from a first chip to replace the defective primary circuitry of a second chip; and control circuitry electrically connected to the plural semiconductor chips to remap external signals directed at the defective primary circuitry of the second chip to the redundant circuitry of the first chip when there are more defective primary circuitry on the second chip than there are redundant circuitry on the second chip.

20. The multichip integrated circuit package of claim 19 further including a lead frame attached to the substrate and having a plurality of conductive leads each having an electrode protruding therefrom and each being connected to a unique bonding pad on one of the plural semiconductor chips.

21. A multichip, integrated semiconductor circuit package, comprising:

a plurality of semiconductor chips fabricated in a unsingulated manner on and on a single co-extensive substrates the substrate being selected from the group consisting of monocrystalline silicon, gallium arsenide, silicon, silicon-on-sapphire, or silicon on insulator;

each of the plurality of semiconductor chips being electrically isolated from each other along a terminal boundary of the substrate, and each including redundant circuitry capable of selectively replacing primary circuitry;

a plurality of electrical interconnects coupled to the chips to selectively couple the redundant circuitry from one chip to another chip, and an encapsulation compound at least partially encapsulating the chips and the substrate.

* * * * *

UNITED STATES PATENT AND TRADEMARK OFFICE
CERTIFICATE OF CORRECTION

PATENT NO.    : 6,438,045 B1                                              Page 1 of 1
DATED         : August 20, 2002
INVENTOR(S)   : Jerrold L. King and Jerry M. Brooks It is certified that error appears in the above-identified patent and that said Letters Patent is hereby corrected as shown below:

<u>Title page,</u>
Item [75], Inventors, delete "Morgan Hill, CA" and insert -- Higley, AZ --, therefor.

<u>Column 2,</u>
Line 39, delete "integrally" after "chips".

<u>Column 4,</u>
Line 38, delete "RAMs" and insert -- DRAMs --, therefor.
Line 45, delete "a" after "the".

<u>Column 10,</u>
Line 19, delete "claim" and insert -- claim 5 --, therefor.

Signed and Sealed this

Twenty-fourth Day of December, 2002

JAMES E. ROGAN
*Director of the United States Patent and Trademark Office*